United States Patent [19]

Nakamura et al.

[11] Patent Number: 4,974,208

[45] Date of Patent: Nov. 27, 1990

[54] MICROCOMPUTER INCORPORATING A NONVOLATILE SEMICONDUCTOR MEMORY

[75] Inventors: Hideo Nakamura, Tokyo; Terumi Sawase, Sayama, both of Japan

[73] Assignee: Hitachi, Ltd., Tokyo, Japan

[21] Appl. No.: 501,542

[22] Filed: Mar. 30, 1990

Related U.S. Application Data

[62] Division of Ser. No. 329,515, Mar. 28, 1989, Pat. No. 4,920,518.

[30] Foreign Application Priority Data

Apr. 23, 1985 [JP] Japan .................................. 60-86797
Apr. 26, 1985 [JP] Japan .................................. 60-90268
Jul. 3, 1985 [JP] Japan .................................. 60-144719

[51] Int. Cl.$^5$ .................................. G11C 11/40
[52] U.S. Cl. .................................. 365/228; 365/189.01; 371/10.1; 371/13; 371/195
[58] Field of Search .................................. 365/228, 189.01; 371/10, 13, 21

[56] References Cited

U.S. PATENT DOCUMENTS 4,327,410 4/1982 Patez et al. .......................... 365/228
4,744,062 5/1988 Nakamura et al. ................. 365/228
4,920,518 4/1990 Nakamura et al. ................. 365/228

Primary Examiner—Terrell W. Fears
Attorney, Agent, or Firm—Antonelli, Terry, Stout & Kraus

[57] ABSTRACT

A microcomputer with a non-volatile memory has a plurality of nonvolatile data memory elements arranged in a matrix and a means for reading data from the memory elements in accordance with an address signal which specifies a position in the matrix. A protecting data memory element for storing at least one-bit protection data is disposed in the matrix. Whether a programming (writing), erasing or reading operation with respect to the data memory elements is to be allowed or inhibited is determined in accordance with the contents of the protecting data memory element which are read out in response to the address signal.

9 Claims, 13 Drawing Sheets

FIG. 3

|  |  | W (21) | WH (221) | D (231) | S (241) | I (25) | WELL (111) |
|---|---|---|---|---|---|---|---|
| READING MODE | SELECTED | $V_{cc}$ | 0 | $D_{out}$ | 0 | $V_{cc}$ | 0 |
|  | NOT SELECTED | 0 | 0 | HiZ | 0 | $V_{cc}$ | 0 |
| PROGRAMMING MODE | SELECTED | $V_{cc}$ | $V_{cc}$ | $-V_{pp}$ | 0 | $-V_{pp}$ | $-V_{pp}$ |
|  | NOT SELECTED | 0 | $-V_{pp}$ | $-V_{pp}$ | 0 | $-V_{pp}$ | $-V_{pp}$ |
| ERASING MODE | SELECTED | $V_{cc}$ | $-V_{pp}$ | $V_{cc}$ | $V_{cc}$ | $V_{cc}$ | $V_{cc}$ |
|  | NOT SELECTED | 0 | $V_{cc}$ | $V_{cc}$ | $V_{cc}$ | $V_{cc}$ | $V_{cc}$ |

FIG. 4

|  |  | W (21) | WH (222) | D (232) | S (242) | I (25) | WELL (112) |
|---|---|---|---|---|---|---|---|
| PROHIBITION AGAINST PROGRAMMING | SELECTED | $V_{cc}$ | 0 | 0 | 0 | $-V_{pp}$ | 0 |
|  | NOT SELECTED | 0 | 0 | 0 | 0 | $-V_{pp}$ | 0 |
| PROHIBITION AGAINST ERASING | SELECTED | $V_{cc}$ | 0 | 0 | 0 | $V_{cc}$ | 0 |
|  | NOT SELECTED | 0 | 0 | 0 | 0 | $V_{cc}$ | 0 |

| | READ DATA | INHIBITING CONDITION |
|---|---|---|
| 52 | 0 | PROGRAMMING INHIBITION SIGNAL : DISABLE |
| | 1 | PROGRAMMING INHIBITION SIGNAL : ACTIVE |
| 53 | 0 | ERASING INHIBITION SIGNAL : ACTIVE |
| | 1 | ERASING INHIBITION SIGNAL : DISABLE |

# MICROCOMPUTER INCORPORATING A NONVOLATILE SEMICONDUCTOR MEMORY

This is a divisional of application Ser. No. 329,515, filed Mar. 28, 1989 now U.S. Pat. No. 4,920,518.

BACKGROUND OF THE INVENTION

The present invention relates to a semiconductor memory and, more particularly, to a semiconductor memory having a security function for preventing programming (writing), erasing and reading of a nonvolatile memory.

An EEPROM (Electrically Erasable and Programmable Read Only Memory) is a nonvolatile memory and is therefore electrically erasable and programmagle. However, one concern with such a memory is that data to be protected might be rewritten. To protect the data stored in such a non-volatile memory, a method has already been proposed wherein a security bit is employed and any external access to the nonvolatile memory is inhibited in accordance with the state of the security bit (for example, see "Electronics Design", Mar. 3, 1983, pp. 123 to 128). More specifically, a write-only security register which is separate from a normal memory block is prepared, and any access to the normal memory block is inhibited in accordance with the state of the security bit. In such case, the following method may be employed for forming a write-only security register by an EEPROM. Namely, the erasing operation of the security register is allowed only when the whole of the normal memory block is erased. Thus, after the security register has been programmed so as to protect the normal memory block, it is impossible to access the normal memory block unless the data stored in the normal memory block is destroyed. In this method, however, no consideration is taken for the security function for preventing rewriting of data once programmed. In addition, since erasing and programming conditions for an EEPROM constituting a security register differ from those for a normal memory block, the security register must be provided with independent erasing and programming circuits, which leads to a complicated circuit configuration. Further, since the security function of the above-described method is carried out for the entire memory as one unit, it is not possible to control the security function for each of the divided portions of the memory, each divided portion having a relatively small capacity.

There is another conventional memory protecting method in which a region to be protected and contents to be protected are designated by software. This method, however, requires another memory for storing such data and contents to be protected, together with system software, which leads to an increase in size or scale of the memory device as a whole. Therefore, this method is not suitable for data protection of a nonvolatile memory or the like which has a relatively small memory capacity.

A microcomputer which is applied to, for example, a cash card and which incorporates a nonvolatile memory is demanded wherein the nonvolatile memory should be divided into a plurality of areas which are respectively used for various purposes, such as a program storing area, ID code storing area and data storing area. In this case, for realization of a highly reliable system, it is very important to enable inhibition of reading, programming (writing) and erasing for each of the divided areas each constituted by a small region.

SUMMARY OF THE INVENTION

Accordingly, it is an object of the present invention to provide a semiconductor integrated circuit with a nonvolatile memory which is so designed that it is possible to set conditions for inhibiting rewriting or erasing simply by giving various security functions even to a plurality of divided relatively small areas of the nonvolatile memory.

To this end, the present invention provides a semiconductor integrated circuit with a nonvolatile memory having a plurality of nonvolatile data memory elements arranged in a matrix and a means for effecting reading from the nonvolatile memory elements in accordance with an address signal for specifying a position in the matrix, wherein a protecting data memory element for storing at least 1-bit memory protection data is disposed in the nonvolatile memory element matrix, and whether a programming (writing), erasing or reading operation with respect to the nonvolatile data memory elements is to be allowed or inhibited is determined in accordance with the contents of the protecting data memory element.

BRIEF DESCRIPTION OF THE DRAWINGS

FIG. 3 shows the relationship between various voltages employed when the data memory elements illustrated in FIG. 2 are programmed and erased;

FIG. 4 shows the relationship between various voltages employed when programming and erasing of the protecting data memory element illustrated in FIG. 2 are inhibited;

FIG. 25 is a time chart showing a conventional semiconductor integrated circuit with a nonvolatile memory.

DESCRIPTION OF THE PREFERRED EMBODIMENTS

Preferred embodiments of the present invention will be described hereinunder in detail with reference to the accompanying drawings.

Figure 12:
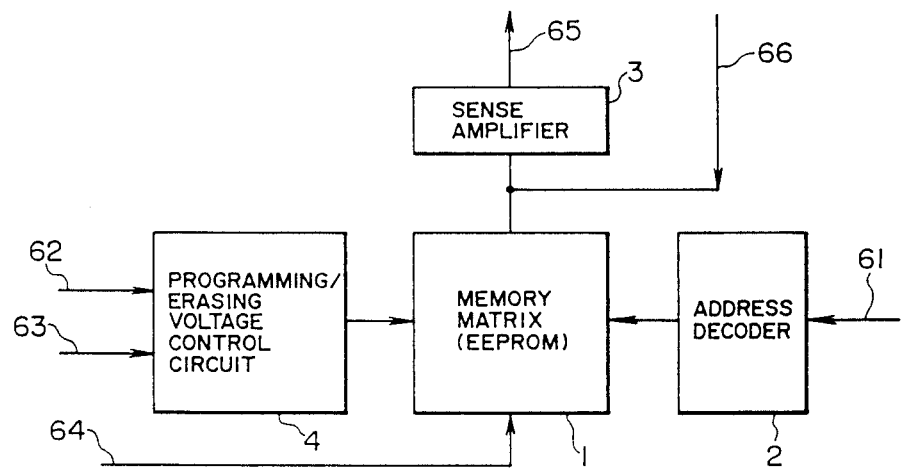
FIG. 12 shows the arrangement of a semiconductor integrated circuit with a nonvolatile memory which has no memory security function.

FIG. 12 shows the basic arrangement of a nonvolatile semiconductor memory which may be employed in the present invention and which is electrically programmable and erasable.

In FIG. 12, the reference numeral 1 denotes a nonvolatile memory matrix (EEPROM matrix), 2 an address decoder, 3 a sense amplifier, and 4 a programming/erasing voltage control circuit. Address inputs 61, data to be programmed (written) 66 and a starting signal for programming (writing) 62 are respectively applied to the address decoder 2, the nonvolatile memory matrix 1 and the programming/erasing voltage control circuit 4, so as to effect programming (writing) of data. When address inputs 61 and a starting signal for reading 64 are respectively applied to the address decoder 2 and the programming/erasing voltage control circuit 4, read data 65 is obtained from the sense amplifier 3. When address inputs 61 and a starting signal for erasing 63 are respectively applied to the address decoder 2 and the programming/erasing voltage control circuit 4, the memory contents are erased.

Figure 13:
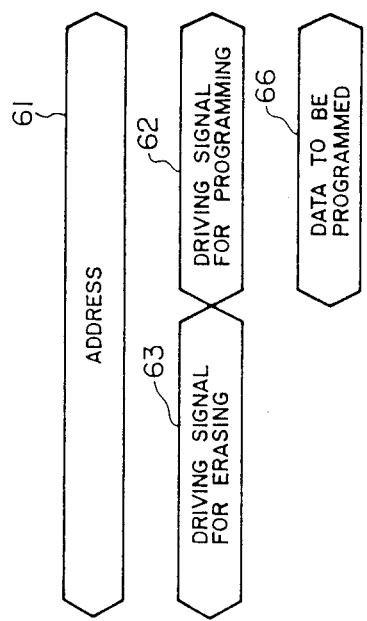
FIG. 13 shows erasing and programming operations of the semiconductor integrated circuit illustrated in FIG. 12.

FIG. 13 shows programming (writing) and erasing operations in relation to the volatile memory matrix 1.

Rewriting for the nonvolatile memory matrix 1 is effected in such a manner that, as shown in FIG. 13, an address signal 61 and a starting signal for erasing 63 are input to erase a nonvolatile memory element corresponding to the specified address, and a starting signal for programming 62 and data to be programmed 66 are then input to write the data in the nonvolatile memory element concerned.

Figure 14:
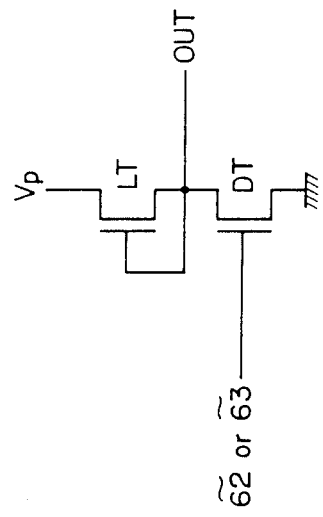
FIG. 14 shows the arrangement of the programming/erasing voltage control circuit illustrated in FIG. 12.

FIG. 14 is a circuit diagram of the programming/erasing voltage control circuit 4 shown in FIG. 12.

The programming/erasing voltage control circuit 4 is adapted to apply a high voltage required for programming or erasing to a terminal of each memory element in the nonvolatile memory matrix 1. The circuit 4 is, as shown in FIG. 14, composed of MOS transistors (a load transistor LT and a driving transistor DT) and is adapted to effect ON/OFF control of the output OUT in response to the starting signal for programming 62 and the starting signal for erasing 63.

When the present invention is applied to a nonvolatile semiconductor memory having an arrangement such as that shown in FIG. 12, the present invention may be carried out in various practical forms, e.g., a first form, a second form, a combination of the first and second forms, and a modification of the second form.

FIGS. 1(a) to 1(d) schematically show the arrangements of semiconductor integrated circuits in accordance with various embodiments, respectively, of the present invention.

Figure 1A:
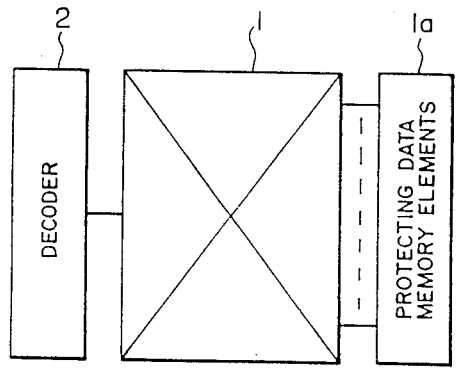
FIGS. 1(*a*) to 1(*d*) show the arrangements of a semiconductor integrated circuit with a nonvolatile memory according to the present invention.

Referring first to FIG. 1(a), there is shown the arrangement of a practical form according to a first aspect of the present invention. The nonvolatile memory matrix 1 for storing data is provided with protecting data memory elements 1a each storing at least 1-bit memory protection data (security data) in such a manner that each memory element 1a corresponds to one line consisting of a group of data memory elements arrayed in the row direction of the matrix, i.e., the direction in which word lines extends. The contents of each protecting data memory element 1a are read and, when the read data is, e.g., "1", a programming (writing), erasing or reading operation is allowed, whereas, when the read data is "0", any of the operations is inhibited, whereby the contents of the data storing memory matrix 1 are protected.

Figure 1B:
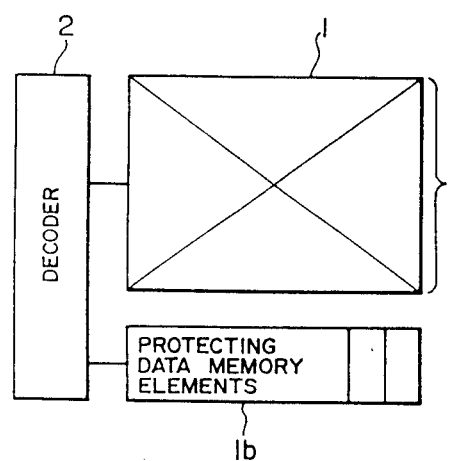

In the arrangement shown in FIG. 1(b), a part of the nonvolatile memory matrix 1, i.e., at least one line in the matrix 1, is constituted by a group of protecting data memory elements 1b for storing protection data (security data). The contents of the protecting data memory elements 1b are read and, when the read data is "1", a programming (writing), erasing and reading operation for the whole or a part of the data memory matrix 1 is allowed, whereas, when the read data is "0", any of the operations is inhibited, whereby the contents of the data memory matrix 1 are protected.

Figure 1C:
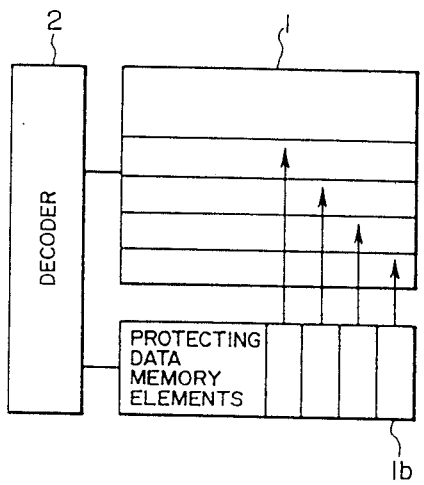

The arrangement shown in FIG. 1(c) is a modification of the arrangement shown in FIG. 1(b). At least one line in the matrix 1 is constituted by a group of protecting data memory elements 1b for storing protection data in the same manner as in the case of the arrangement shown in FIG. 1(b). In the arrangement shown in FIG. 1(c), however, bits of the protecting data memory elements 16 are respectively allocated to the rows of the data memory matrix 1 as indicated by the arrows. The contents of the protecting data memory elements 1b are read and, when the first bit from the right represents, for example, "1",, a programming (writing), erasing or reading operation in relation to the lowermost row in the memory matrix 1 is allowed. When the second bit from the right represents "0", any of the operations in relation to the second row from the bottom of the memory matrix 1 is inhibited. When the third bit from the right represents "1", any of the operations in relation to the third row from the bottom of the memory matrix 1 is allowed. In this way, the contents of each of the rows in the memory matrix 1 are protected. The bits of the protecting data memory elements 1b may also be respectively allocated to the columns of the memory matrix 1.

Figure 1D:
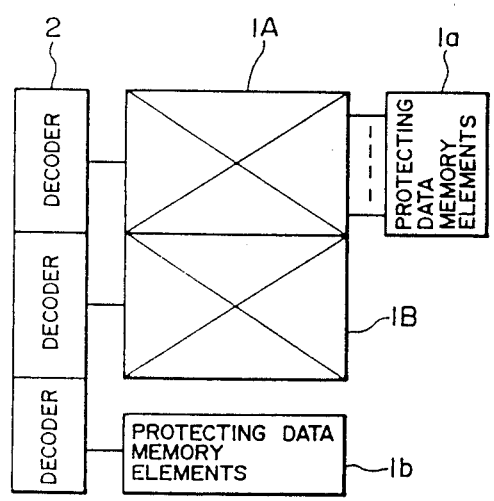

The arrangement shown in FIG. 1(d) is a combination of the data protecting arrangements respectively illustrated in FIGS. 1(a) and 1(b). Namely, the nonvolatile memory matrix 1 is divided in the column direction into two halves 1A and 1B, and the contents of the half 1A of the memory matrix 1 are protected by the protecting method shown in FIG. 1(a), while the contents of the other half 1B are protected by the protecting method shown in FIG. 1(b). More specifically, the half 1A of the nonvolatile memory matrix 1 is provided with protecting data memory elements 1a each storing at least 1-bit protection data in such a manner that each memory element 1a corresponds to one row of the matrix half 1A, and at least one row of the half 1B of the memory matrix 1 is constituted by protecting data memory elements 1b, whereby the memory contents are protected on the basis of each memory protecting data and in accordance with a selected address.

The operations of the arrangements shown in FIGS. 1(a) and 1(b) will be described hereinunder in detail by way of practical embodiments, respectively. Since the arrangements respectively shown in FIGS. 1(c) and 1(d) are formed by applying the operations of the arrangements respectively shown in FIGS. 1(a) and 1(b), detailed description of the operations thereof is omitted.

Figure 2:
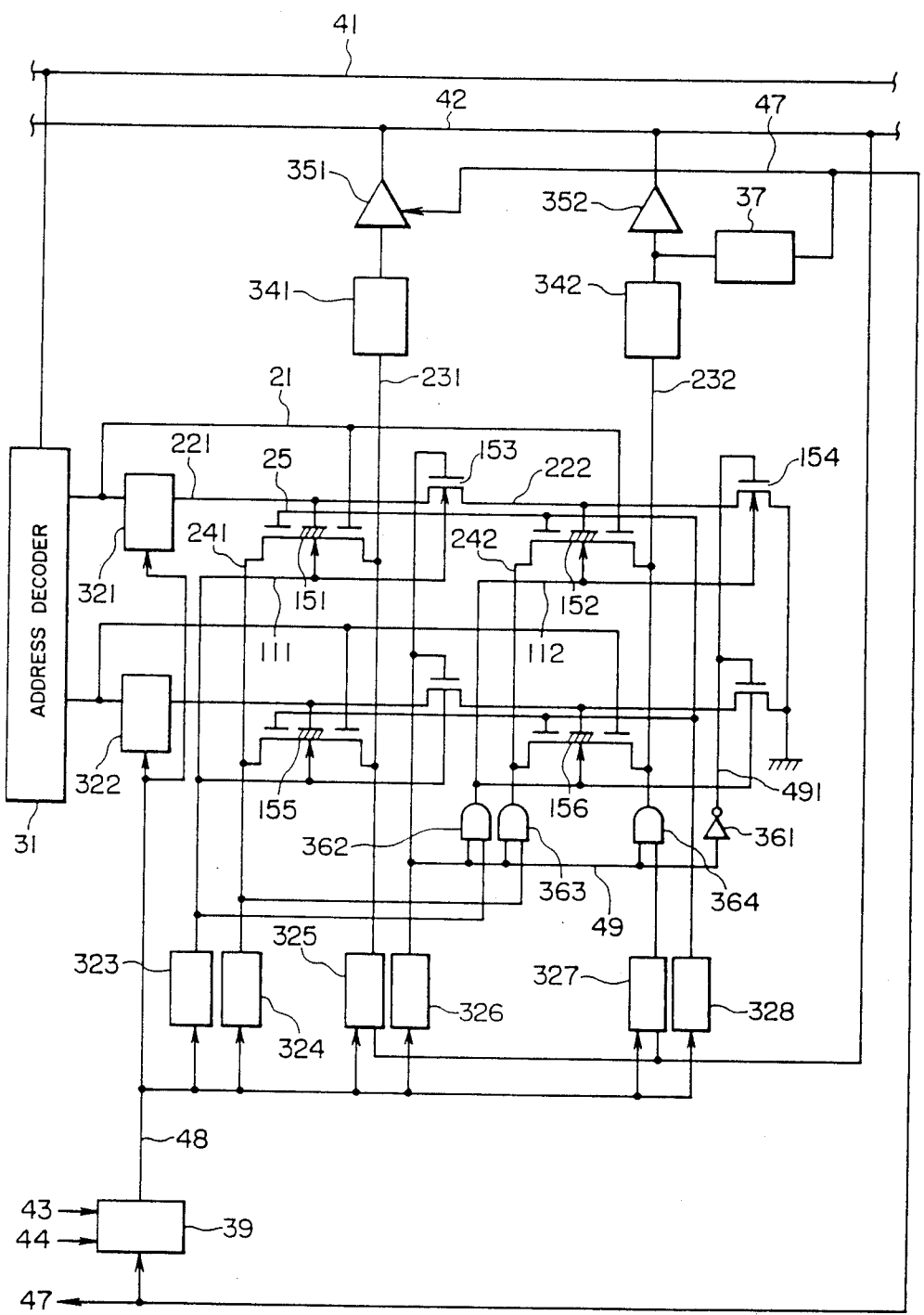
FIG. 2 is a circuit diagram of one embodiment of the present invention.

FIG. 2 shows the arrangement of a semiconductor integrated circuit in accordance with a first embodiment of the present invention in which various security functions can be given to each of the relatively small divided memory areas.

In FIG. 2: the reference numeral 31 denotes an address decoder; 37 a temporary storage register for temporarily storing protecting data; 39 an internal control circuit; 41 an address bus, 42 a data bus; 321 to 328 high voltage control circuits; 341 and 342 sense amplifiers; 351 and 352, output drivers; 151, 152, 155 and 156, transistors respectively constituting nonvolatile memory elements (EEPROM); and 153, 154 transistors for turning ON/OFF the applied gate voltage of the nonvolatile memory elements. A typical conventional nonvolatile semiconductor memory is provided with only the left-hand half of the arrangement shown in FIG. 2, i.e., the address decoder 31, the nonvolatile memory elements (EEPROM) 151, 155, the sense amplifier 341 for reading data, the output driver 351 and the high voltage control circuits 321 to 326 and 328.

FIG. 3 shows the relationship, between various voltages applied to the memory elements when the memory shown in FIG. 2 is accessed.

Each of the reading, programming (writing) and erasing operations is effected by applying the voltage conditions shown in FIG. 3 to the nonvolatile memory elements 151 and 155. More specifically, in a reading mode, a voltage $V_{cc}$ is applied to a word line (W) 21 from the address decoder 31, and a high voltage word line (WH) 221 is set at 0V, whereby the non-volatile memory element 151 is selected, and the contents ($D_{out}$) of the element 151 are read out to a data line 231. In a programming mode, a voltage $V_{cc}$ is applied to the word line (W) 21 from the address decoder 31, and a volgate $V_{cc}$ is similarly applied to the high voltage word line (WH) 221 from the high voltage control circuit 321, while a voltage $-V_{pp}$ is applied to a well region (in which the memory element 151 is disposed) 111 from the high voltage control circuit 323, whereby "1" can be written into the selected memory element 151. In an erasing mode, a voltage $V_{cc}$ is applied to the word line (W) 21 from the address decoder 31, and a voltage $-V_{pp}$ is applied to the high voltage word line (WH) 221 from the high voltage control circuit 321, while the well voltage is set at $V_{cc}$, whereby the contents of the selected memory element 151 can be erased.

According to the present invention, the right-hand half of the arrangement shown in FIG. 2 is added to the above-described conventional arrangement. More specifically, one or more protecting data memory elements 152, 156 for storing protection data are disposed for each word line 221. Thus, the arrangement according to the present invention is additionally provided with the function which enables determination as to whether access to a data memory element is to be allowed or prohibited in accordance with the state of the protecting data memory element corresponding to the specified address. Circuits additionally provided for this purpose are the control gates 153, 154 for ON/OFF controlling the supply of high gate voltage applied to the memory elements, the sense amplifier 342 for protecting data, the output driver 352 for protecting data and the temporary storage register 37.

In the present invention, one side of a data memory matrix is provided with protecting data memory elements 152 (156) for storing protection data in such a manner that one or plurality of memory elements 152 (156) correspond to a series of data memory elements (e.g., elements connecetd to the word lines 21 and 221) which are selected through word lines. When a word line is selected, the contents of the associated protecting data memory elements 152 (156) are simultaneously read out so as to prohibit any undesirable programming (writing), erasing or reading operation.

The memory elements 152 (156) for storing protection data permit reading, programming (writing) and erasing in a manner similar to that in the case of the conventional data memory elements 151 (155). However, when the data memory elements 151 (155) are being subjected to a programming or erasing operation, the protecting data memory elements 151 (155) must not lose the data stored therein. For this reason, when a programming or erasing operation is effected for the data memory elements 151 (155), the protecting data memory elements 152 (156) need to be given conditions different from those given to the data memory elements 151 (155).

FIG. 4 shows the relationship between various voltages for prohibiting neither programming nor erasing operation in relation to the protecting data memory elements shown in FIG. 2.

To program data, $V_{cc}$, $V_{cc}$, $-V_{pp}$, $-V_{pp}$ and $-V_{pp}$ are applied to the word line (W) 21, the high voltage word line (WH) 221, the data line (D) 231, the I line 25 and the WELL line 111, respectively, as shown in FIG. 3. On the other hand, as to the protecting data memory elements, although $V_{cc}$ and $-V_{pp}$ are respectively applied to the word line (W) and the I line 25 in the same manner as in the case of the data memory elements, 0V is applied to the WH, D and WELL lines for the prohibition against programming, as shown in FIG. 4. Thus, there is no fear of any protecting data being undesirably programmed. When the data stored in the data memory elements is erased also, 0V is applied to the WH, D, S and WELL lines so as to prohibit the protecting data (security data) from being undesirably erased. The gates 153, 154 and the high voltage inverter 361 shown in FIG. 2 are circuits which give the voltage conditions shown in FIG. 4 in order to prevent the destruction of the protecting data.

The following is a description of the operation of the arrangement shown in FIG. 2 in each of the reading, programming and erasing modes with security functions.

Figure 5:
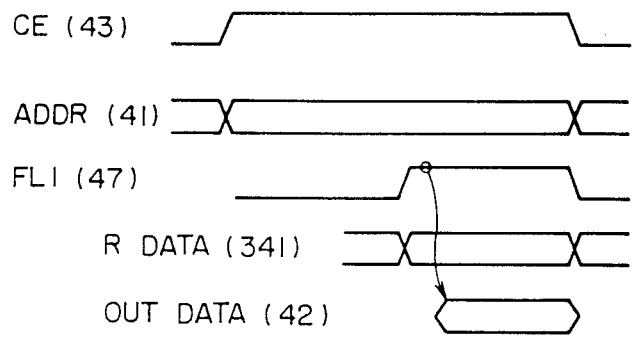
FIG. 5 is a time chart showing a reading operation of the arrangement illustrated in FIG. 2.

FIG. 5 is a timing chart showing the operation of the semiconductor memory shown in FIG. 2 in a reading mode.

When a chip select signal 43 and address inputs 41 are applied, the semiconductor memory starts to operate. A word line 21 corresponding to the specified address is selected, and the contents of the data memory element 151 and the contents of the protecting data memory element 152 are read out by the sense amplifiers 341 and 342, respectively. The output of the sense amplifier 342 is set in the temporary storage register 37 and, when the output 47 thereof is "1", the output driver 351 for data memory elements is driven to read out the data to the data bus 42. When the protecting data output 47 is "0", the output driver 351 is controlled such that the driver 351 is prohibited from outputting any data to the data bus 42. In a reading mode, the contents of the data memory element 151 and the protecting data memory element 152 are simultaneously read. There is therefore no delay in the operation due to the addition of the security function.

Figure 6:
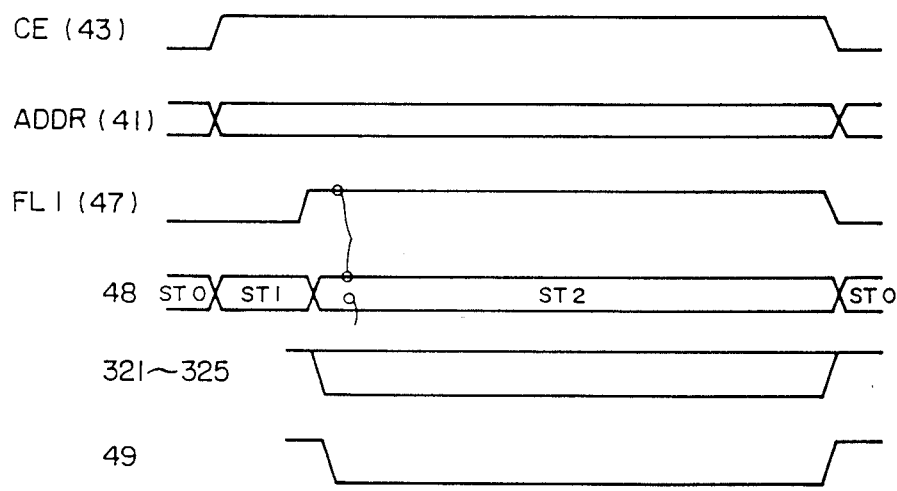
FIG. 6 is a time chart showing a programming or erasing operation of the arrangement illustrated in FIG. 2.

FIG. 6 is a time chart showing the operation of the semiconductor memory shown in FIG. 2 in a programming or erasing mode.

In this case also, the operation of the semiconductor memory is started in response to the application of the chip select signal 43 and the address inputs 41 in the same manner as in the case of the reading mode. The internal control circuit 39 first sets the control mode at the reading mode (ST1), reads out the contents of the protecting data memory element 152 corresponding to the specified address, and stores the read data in the temporary storage register 37. When the output 47 is "1", the internal control mode of the internal control circuit 39 is shifted to either the programming or erasing mode (ST2). During the erasing mode (ST2), the high voltage control circuits 321 to 325 respectively generate the high voltages shown in FIG. 3, and a programming or erasing operation is thereby effected. At the same time, the signal line 49 connected to the high voltage control circuit 326 is lowered to a level "0". In consequence, the gate 153 is turned OFF, and the outputs of the gates 362 to 364 are brought to OV. Since the output 491 of the inverter 361 is "1", the gate 154 of the protecting data memory element 152 is turned ON, and the applied gate voltage 222 of the memory element 152 is set at OV. As a result, the relationship between the voltages respectively applied to the protecting data memory elements 152 and 156 satisfies the voltage conditions shown in FIG. 4, so that, when the data memory elements 151 and 155 are being subjected to a programming or erasing operation, the data stored in the protecting data memory elements 152 and 156 are reliably protected. In a programming or erasing mode, reading of protecting data and programming or erasing of data are executed in a time series manner. However, since the programming or erasing time is $10^3$ to $10^5$ times longer than the reading time, there is no practical increase in the access time due to the reading of protecting data.

As described above, in this embodiment, a data memory element and a protecting data memory element are disposed on a common word line and, in a reading mode, both the memory elements are simultaneously accessed in order to control the delivery of the read data to the data line in accordance with the read protecting data. In a programming or erasing mode, protecting data is first read, and the contents of the data memory element are then read, so that it is possible to control the programming or erasing operation on the basis of the read processing data. As a result, the memory protection for each of the word lines can be realized without the aid of any software, and it is possible to eliminate any increase in access time due to the memory protection. Since the memory protection can be effected for each of the word lines, it becomes possible to realize memory protection using the memory area efficiently without waste. In this embodiment, further, the address decoder 31 and the control circuit for the word line 21 can be used by the data memory element and the protecting data memory element in common. It is therefore possible to minimize the increase in area when realizing the security function.

Figures 7, 8:
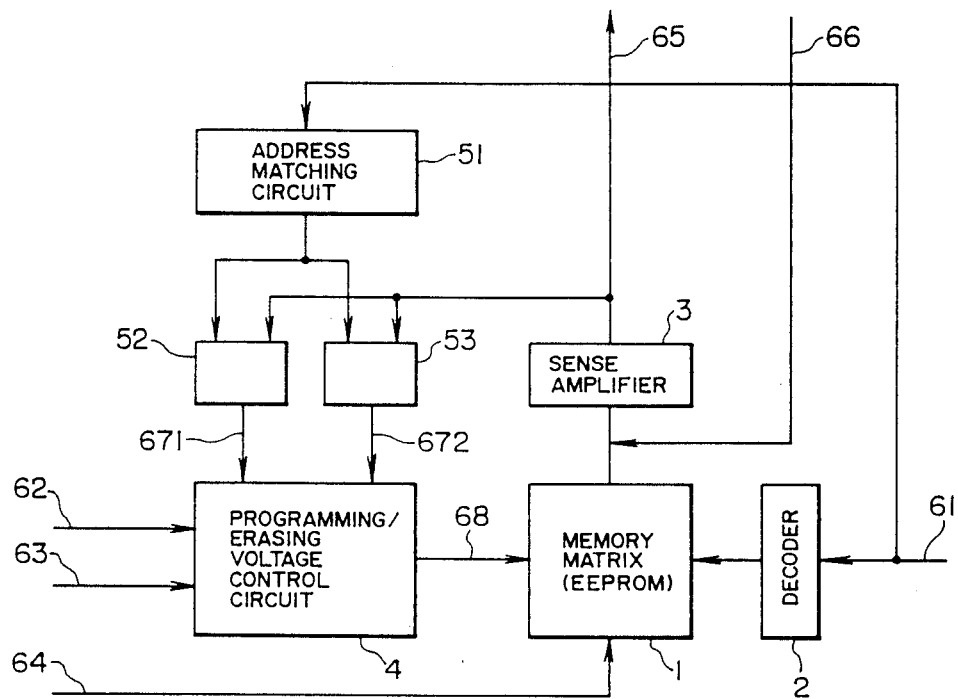
FIG. 7 shows the arrangement of a semiconductor integrated circuit with a nonvolatile memory in accordance with another embodiment of the present invention.
FIG. 8 shows the relationship between the data read out from the protecting data memory element shown in FIG. 7 and inhibiting conditions.

FIG. 7 shows the arrangement of a semiconductor integrated circuit with a volatile memory in accordance with a second embodiment of the present invention.

In FIG. 7, the same reference numerals as those in FIG. 12 denote the same portions or members. The semiconductor integrated circuit shown in FIG. 7 is formed by adding an address matching circuit 51, a programming inhibition data latch 52 and an erasing inhibition data latch 53 to the circuit configuration shown in FIG. 12. A programming inhibition signal 671 and an erasing inhibition signal 672 are so set that the signal 671 is made active in response to the output of data representing a programmed state of a group of protecting data memory elements provided in any desired region within the memory matrix (EEPROM) 1, e.g., the lowermost or uppermost row in the matrix 1, whereas the signal 672 is made active in response to the output of data representing an erased state of the protecting data memory elements.

FIG. 8 shows the relationship between the protection data (security data) shown in FIG. 7 and inhibiting conditions.

As will be understood from FIG. 8, if the programmed state is represented by data "1", while the erased state is represented by data "0", when the data is "0", the latch 52 disables the programming inhibition signal 671, whereas, when the data is "1", the latch 52 activates the signal 671. When the data is "0", the latch 53 activates the erasing inhibition signal 672, whereas, when the data is "0", the latch 53 disables the signal 672.

The following is a description of a method of testing the security function of the semiconductor integrated circuit and a method of setting a security function which can not be restored.

First, when the address of a protecting data memory element storing protection data in the EEPROM matrix is specified by an address signal 61, the address matching circuit 51 makes judgement as to whether or not the specified address coincides with a registered address, and thereby applies a gate signal (latching instruction) to the latches 52 and 53. In addition, data "1" or "0" is read out from the memory matrix 1 through the sense amplifier 3. In the initial state, the data is fixed at either "1" or "0" depending upon the method of manufacturing semiconductor elements. If, for example, the data is "1", the programming inhibition signal 671 is made active, and the erasing inhibition signal 672 is disabled from the conditions shown in FIG. 8. Accordingly, it is possible to change the state of any data memory element from "1" to "0", that is, to erase the data, by specifying any address other than the addresses of the protecting data memory elements, i.e., any address in the ordinary data memory element region within the EEPROM matrix 1.

In addition, it is possible to perform testing as to whether or not the security function is effective by changing the state of a data memory element from "0" to "1", that is, programming (writing) data. The erasing and programming inhibition operations can be tested for all the memory elements in the EEPROM matrix 1 including the protecting data memory elements without any change in state of the security function.

Next, when the memory elements in the protecting data memory element region are set in the erased state "0" and the address of any of the protecting data memory elements is specified to start reading, "0" is read out to the latches 52 and 53. In consequence, the erasing inhibition signal 672 is made active, and the programming inhibition signal 671 is disabled. In this state, it is possible to test the erasing inhibition operation for all the memory elements in the EEPROM matrix 1, as described above.

Next, data is set in the protecting data memory element region so that "0" and "1" are respectively read out to the latches 52 and 53, and the data "0" and "1" are then read out. In this state, all the memory elements in the EEPROM matrix 1 operate as electrically erasable and programmable nonvolatile memory elements which have no security function.

Next, data is set in the protecting data memory element region so that "1" and "0" are respectively read out to the latches 52 and 53, and the data "1" and "0" are read out. In consequence, both the programming and erasing functions of all the memory elements in the EEPROM matrix 1 are prohibited and become unalbe to return to the state wherein the programming and erasing functions can be activated. As a result, the data stored in the EEPROM matrix 1 is prevented from being destroyed thereafter.

Figure 9:
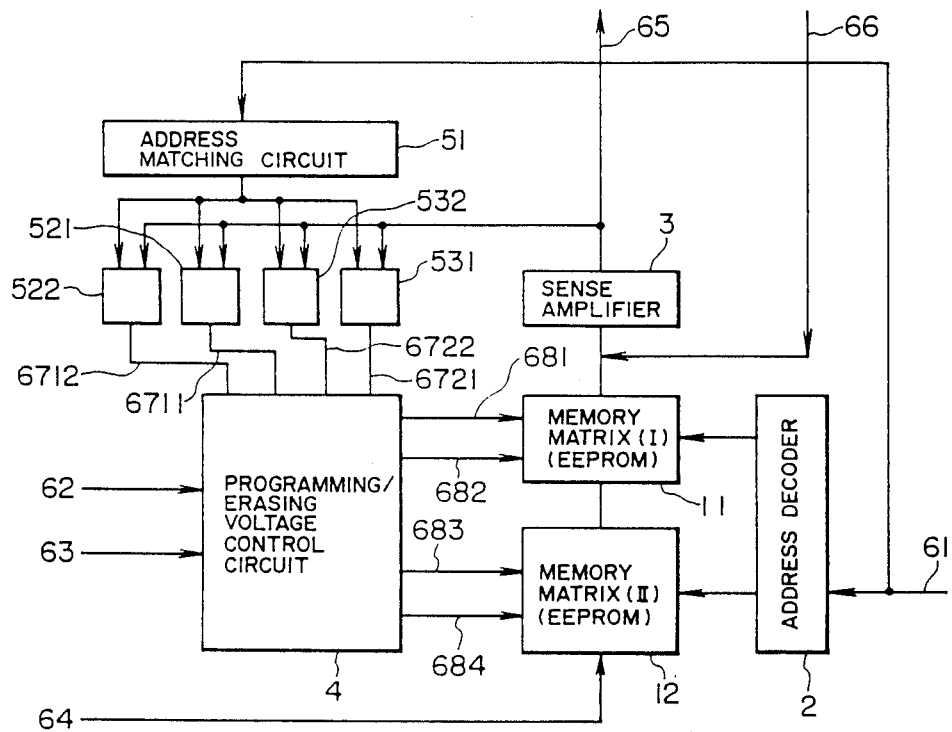
FIG. 9 shows the arrangement of a semicondcutor integrated circuit with a nonvolatile memory in accordance with still another embodiment of the present invention.
Figure 10:
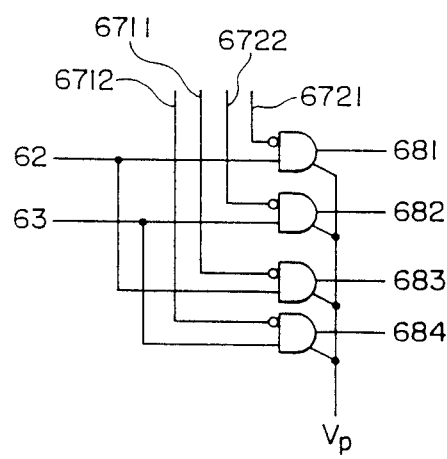
FIG. 10 shows the arrangement of the programming/erasing voltage control circuit illustrated in FIG. 9.

FIG. 9 shows the arrangement of a semiconductor integrated circuit with a nonvolatile memory in accordance with still another embodiment of the present invention, and FIG. 10 shows in detail the programming/erasing voltage control circuit illustrated in FIG. 9.

In the semiconductor integrated circuit shown in FIG. 9, the memory matrix is divided into two regions, i.e., a first region in which the programming and erasing functions are prohibited, and a second region in which either the programming or erasing function is prohibited. More specifically, the arrangement shown in FIG. 9 differs from the arrangement shown in FIG. 7 in that the former arrangement is provided with a pair of programming inhibition data latches 521, 522 and a pair of erasing inhibition data latches 531, 532. The programming/erasing voltage control circuit 4 in FIG. 9 is, as shown in FIG. 10, supplied with inhibition signals 6711, 6712, 6721, 6722, an external starting signal for programming 62 and an external starting signal for erasing 63 so as to control the high voltage $V_p$ and applies its outpus 681, 682 and 683, 684 to two regions 11 and 12, i.e., a memory matrix (I) and a memoty matrix (II), respectively. If the protecting data memory element area is disposed in, for example, the region 11, a programming/erasing inhibition region which cannot be restored can be realized in the EEPROM matrix 11, as described above. If data is set so that programming or erasing inhibition data is read out to the latches 522 and 532 in order to bring the region 11 into a programming/erasing inhibition state which cannot be restored, then, with respect to the EEPROM matrix 12, a programming or erasing inhibition state which cannot be restored is allowed to be specified in accordance wtih the designation represented by the protecting data. If either the memory matrix (EEPROM matrix) 11 or 12 is further divided into regions, and protecting data latches are prepared for each of the regions, and further, the programming/erasing voltage control circuit is rearranged for the divided regions, it is then possible to specify different secure conditions for each of the regions.

Figure 11:
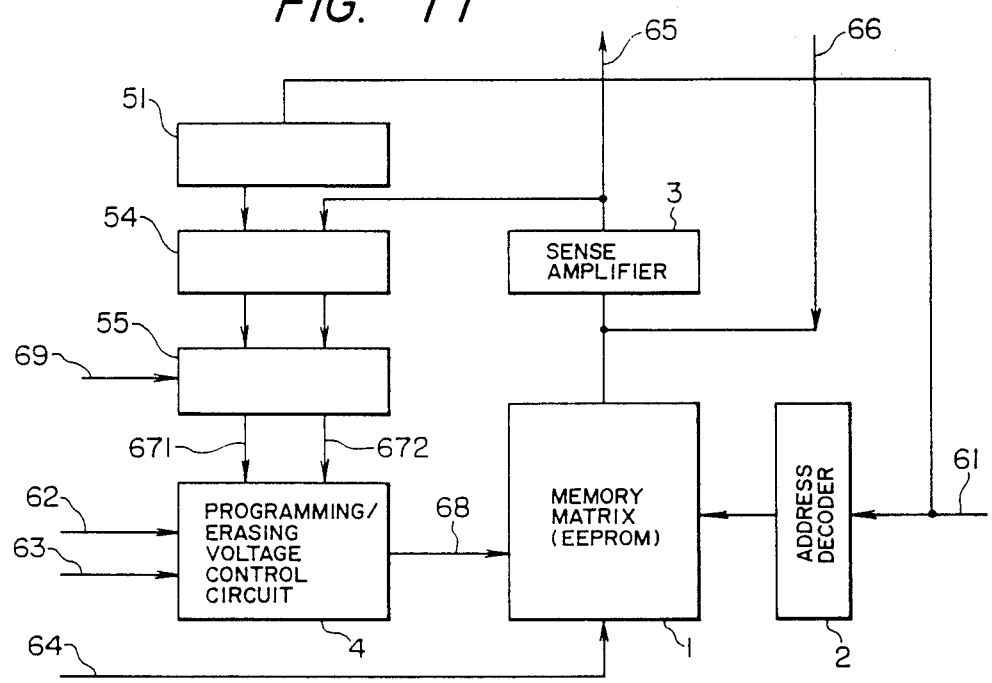
FIG. 11 shows the arrangement of a semiconductor integrated circuit with a nonvolatile memory in accordance with a further embodiment of the present invention.

FIG. 11 shows the arrangement of a semiconductor integrated circuit with a nonvolatile memory in accordance with a further embodiment of the present invention.

In the arrangement shown in FIG. 11, inhibition signals are formed by combining protecting data and an external signal. The reference numeral 54 denotes as protecting data latch, 55 a combination logic circuit, and 69 an external signal. The other signals are the same as those shown in FIGS. 7 and 9. If, for instance, the combination logic circuit 55 is constituted by a dismatching detecting circuit which detects the dis-matching between the output of the latch 54 and the external signal 69, it is possible to realize a key word detection type security function. When the address of a protecting data memory element is specified by the address signal 61, the specified address is judged by the address matching circuit 51, and a gate signal is thereby applied to the latch 54. In consequence, the protecting data read out from the EEPROM matrix 1 through the sense amplifier 3 is stored in the latch 54. For instance, this protecting data is composed of either the programming or erasing inhibition data shown in FIG. 8 and a key word. The dis-matching detecting circuit 55 makes comparison between a key word given by the external signal 69 in the shape of a key word and the output bit pattern which represents the key word stored in the latch 54. When they are not coincident with each other, the signals 671 and 672 shown in FIG. 7 are generated.

Thus, in the embodiments respectively shown in FIGS. 7, 9 and 11, it is possible to prohibit a programming or erasing operation for the memory matrix in accordance with the pattern of the data written in a specific area in the electrically erasable and programmable memory matrix. In addition, the protection data can be stored in a state which cannot be restored. It is therefore possible to realize an electrically erasable and programmable semiconductor integrated circuit with flexible security functions.

As has been described above, it is possible, according to the present invention, to realize various security functions for each of the relatively small divided memory regions. In addition, either a programming or erasing operation for the memory matrix can be prohibited in accordance with the pattern of the data written in a specific area. Accordingly, it becomes possible to effect memory protection using the memory area effectively without waste.

To start a programming or erasing operation for a conventional EEPROM, a method has heretofore been adopted in which a predetermined voltage is applied for a predetermined period time using an internal oscillator and a high voltage generating circuit, such as that mentioned in, e.g., "Digest of Technical Papers, 1983, IEEE, ISSCC, pp. 34 to 35, or pp. 164 to 165. In this method, however, no consideration is taken for enabling the time of writing or erasing to be varied in accordance with the length of the demanded memory storage time.

The present invention also provides a semiconductor integrated circuit with a nonvolatile memory which is so designed that it is possible to change the time of writing or erasing in accordance with the requirements in relation to the memory storage and to reduce the required time of writing or erasing while providing a threshold voltage shift sufficient for the memory storage of nonvolatile memory elements of an EEPROM.

Figure 15:
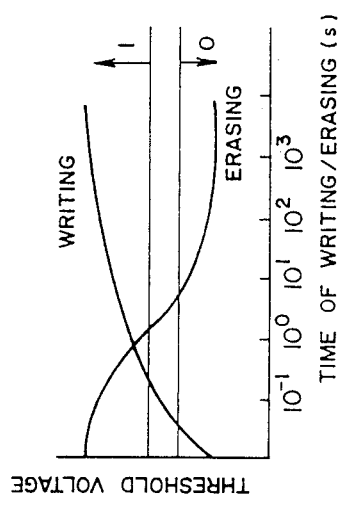
FIG. 15 shows the relationship between the threshold voltage of the nonvolatile memory elements and the time of writing/erasing.
Figure 16:
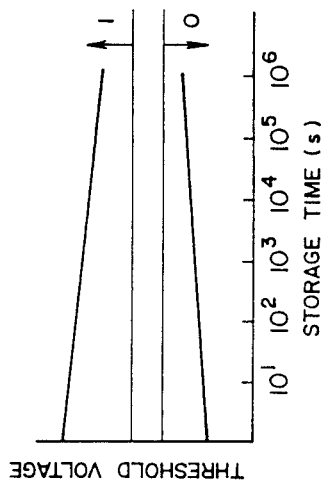
FIG. 16 shows the relationship between the threshold voltage of the nonvolatile memory elements and the storage time.

With the voltage maintained at a constant level, the threshold voltage of a nonvolatile memory element shifts along the exponential axis with respect to the time of writing or erasing, as shown in FIG. 15. The storage time is exponentially related to the threshold voltage of a nonvolatile memory element. Accordingly, when the demand for the storage time differs on each occasion, e.g., when a memory is tested and when final data is stored in the memory, it is possible to effect threshold shift sufficient for satisfying the required storage time characteristics by controlling the time of writing or erasing. Thus, the time required for testing can be reduced.

Figure 17:
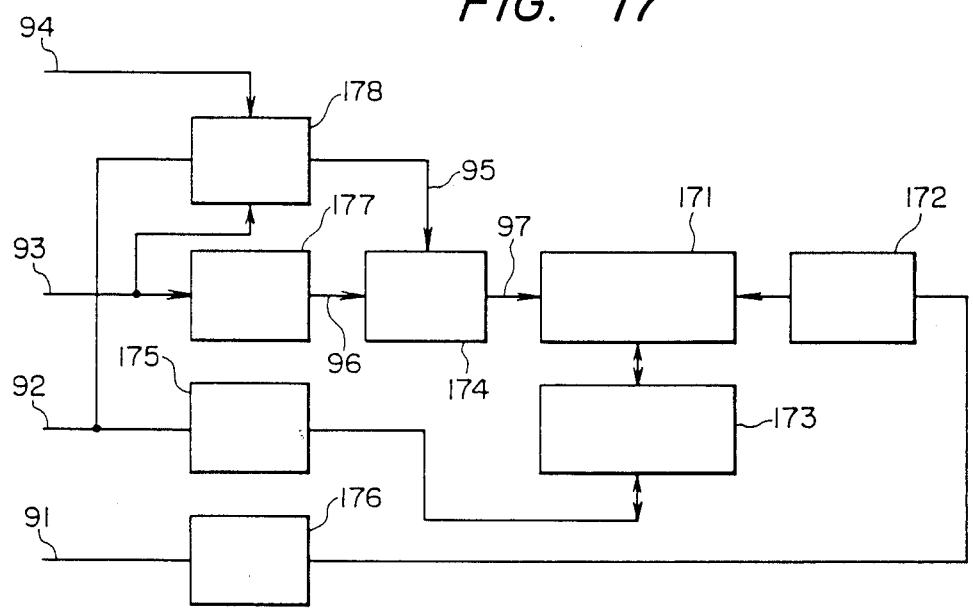
FIG. 17 shows the arrangement of a nonvolatile memory according to the present invention.

A still further embodiment of the present invention will be described hereinunder with reference to FIG. 17. In FIG. 17, the reference numeral 171 denotes a nonvolatile memory matrix, 172 an address decoder, 173 a data input/output circuit, 174 a programming/-erasing voltage control circuit, 175 a data register, 176 an address register, 177 a control signal latch, 178 a timer counter, 91 an address signal, 92 data, 93 a starting signal for writing or erasing, and 94 a clock input.

Figure 18:
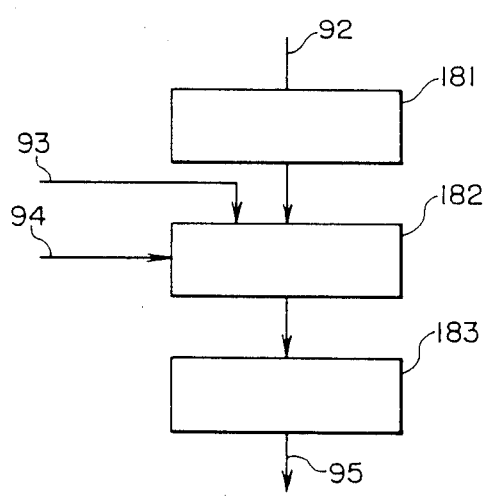
FIG. 18 shows the arrangement of one example of a timer counter.
Figure 19:
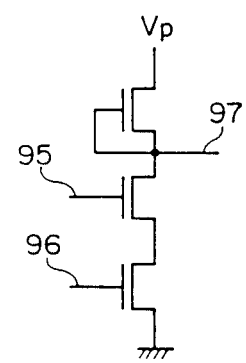
FIG. 19 shows a programming/erasing control circuit.

The timer counter 178 is arranged such that a period of time can be set therein through the data line 92, and the timer couner 178 starts counting time in synchronism with the starting signal for writing or erasing 93 and generates a control signal for a set time duration. The timer counter 178 may be realized by, for example, a circuit such as that shown in FIG. 18. More specifically, the reference numeral 181 denotes a register, 182 a down counter, and 183 a zero detecting circuit. The data which has been set in the register 181 in advance is loaded in the down counter 82 in response to the starting signal 93 and, at the same time, down counting is started in reponse to the clock input 94. The zero detecting circuit 183 outputs the control signal 95 when detecting the fact that the count of the down counter 182 reaches zero. Setting of time in the register 181 is effected from the outside through the data line 92. In addition to this method, data read out from the nonvolatile memory matrix 171 may be set in the register 181. It is also possible to readily realize setting of a fixed value when power is started to be supplied to the circuit. The programming/erasing voltage control circuit 174 is supplied with a high voltage from the outside or a high voltage which is formed by boosting a voltage from a logic circuit power supply by a charge pumping circuit. The circuit 174 thus generates a programming/erasing voltage 97 by a logic gate such as that shown in FIG. 19 and applies the voltage 97 to required terminals of gates, sources, drains, wells in the memory matrix 1.

When a starting signal for programming or erasing 93 is externally applied to the semiconductor integrated circuit shown in FIG. 17, a high voltage 97 is generated through the latch 177 and the programming/erasing voltage control circuit 174 and, at the same time, counting of time is started by the timer counter 178. When a predetermined period of time has elapsed, the control signal 95 is OFF or disappears, and the programming or erasing operation is thereby suspended. The respectively time durations for programming and erasing operations can readily be discriminated from each other by providing two timer counters 178.

Figure 20:
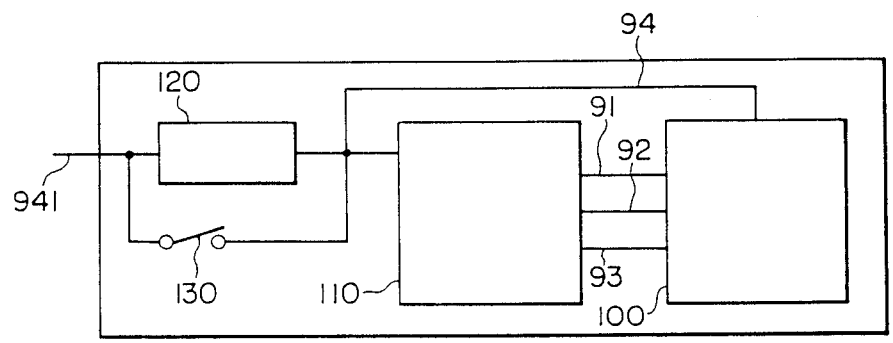
FIG. 20 shows the arrangement of a microcomputer composed of the nonvolatile memory according to the present invention and a microprocessor.

FIG. 20 shows a microcomputer in which a semiconductor integrated circuit 100 such as that shown in FIG. 17 and a data processing unit 110 are fabricated on the same semiconductor substrate. Clocks are supplied directly from an external terminal 941 or through a waveform control circuit 120 and are applied to the circuit 100 and the unit 110 in common. The clock frequency employed in data processing units, particularly one which is constituted by a CMOS device, is not always constant, since the input frequency may be lowered for the purpose of reducing the power consumption. In such a microcomputer LSI, time is set in a timer counter in a memory device from a data processing unit, whereby it is possible to give an optimum time of writing/erasing to the memory device without depending upon the operating frequency of the CPU.

According to this embodiment, it is possible to set a time of writing or erasing as desired. Therefore, the storage time can be adjusted in accordance with the demand, so that it is possible to obtain high reliability and realize an optimum processing time. Thus, it is possible to reduce the time required for testing the semiconductor integrated circuit with a nonvolatile memory, shorten the time required for rewriting data which needs to be periodically written, increase the number of times of available rewriting operations, and improve the reliability with respect to the storage of data for a long period of time. In addition, optimum programming or erasing conditions can be given even when the conditions of clock frequency and supply voltage change.

The present invention further provides a semiconductor integrated circuit with a nonvolatile memory which is so designed that the circuit is readily interfaced with a microcomputer which performs a pipeline operation, and it is possible to ensure in a one-chip memory both a read-only program region and a region for storing data which needs to be rewritten.

The semiconductor integrated circuit with a nonvolatile memory according to the present invention has: a group of electrically erasable and programmable nonvolatile memory elements; a means for selecting a specified region from the memory elements; a means for inputting and outputting data into and from the selected region; a means for controlling writing and reading operations; and a means for temporarily latching a control signal which is to be input to the control means. The feature of the integated circuit according to the present invention resides in the provision of a delay means which is connected to the temperary latch means to delay an erasing or programming (writing) control signal alone.

Figure 21:
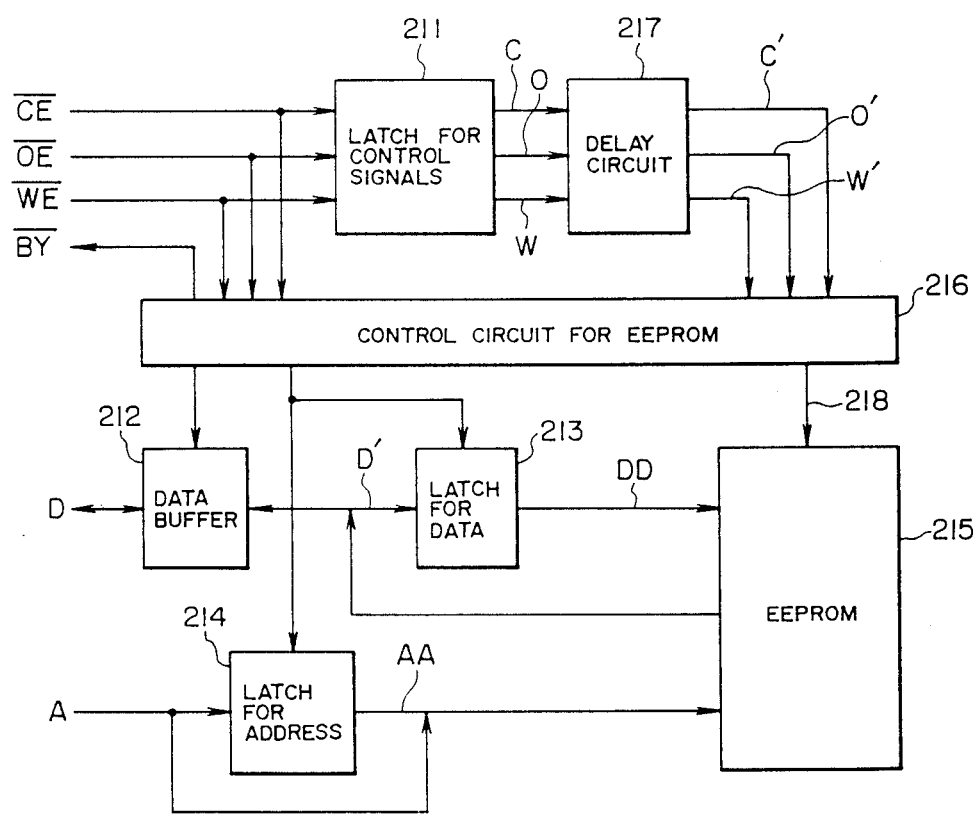
FIG. 21 is a block diagram of a semiconductor integrated circuit with a nonvolatile memory in accordance with a still further embodiment of the present invention.

FIG. 21 shows the arrangement of a semiconductor integrated circuit with a nonvolatile memory in accordance with a still further embodiment of the present invention.

In FIG. 21, the reference symbol $\overline{CE}$ denotes a chip enable signal, $\overline{OE}$ an output enable signal, $\overline{WE}$ a write enable signal, $\overline{BY}$ a busy signal which represents the fact that data is being written into EEPROM, D data, and A an address. The control signals ($\overline{CE}$, $\overline{OE}$ and $\overline{WE}$) are input to a control circuit 216 for EEPROM and also a latch 211 for control signals. The outputs C, O and W from the latch 211 are input to the control circuit 216 through a delay circuit 217. The data D is supplied to a latch 213 for data through a tristate data buffer 212 which is controlled by a control signal from the control circuit 216. The address A is input to an EEPROM 215 through a latch 214 for address, and the address A is also input directly to the EEPROM 215, by-passing the latch 213. The data read out from the EEPROM 215 is output directly to the data buffer 212, by-passing the latch 213. The latches 213 and 214 are controlled by a control signal output from the control circuit 216.

The EEPROM 215 is composed of an EEPROM element matrix, a decoder and so forth and supplied with the data D, the address A and a timing signal 218 from the control circuit 216, wherby reading and programming (writing) operations are executed.

In this embodiment, all the signals required for writing are latched in the semiconductor integrated circuit, and a period of time (a delay) within which an ordinary reading operation can be effected is provided between the latch timing and the writing start timing, thereby allowing a processing for reading to be executed immediately after a write signal has been input. More specifically, by providing the delay circuit 217 shown in FIG. 21, the write timing is delayed, so that, although the read command is input after the write command has been input, in actual processing the reading operation is executed before the writing operation.

Figure 22:
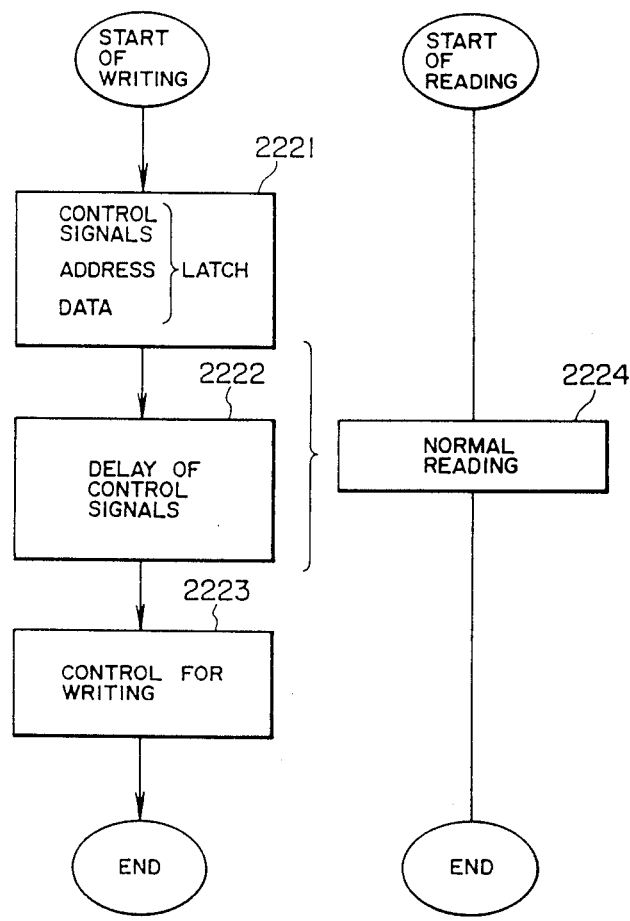
FIG. 22 is a flow chart showing the operation of the semiconductor integrated circuit illustrated in FIG. 21.

FIG. 22 illustrates flow charts respectively showing writing and reading operations of the embodiment in FIG. 21.

The operation of this embodiment will be described below with reference to FIGS. 21 and 22.

In a reading operation, the address A is input, and $\overline{CE}=0$, $\overline{OE}=0$ and $\overline{WE}=1$ are input. It is to be noted that the control circuit 216 for EEPROM is turned ON when the control signal are 0. In the case of a reading operation, the control signals $\overline{CE}$, $\overline{OE}$ and $\overline{WE}$ are input directly to the control circuit 216, and both the latch 211 and the delay circuit 217 are prohibited from outputting signals C, O, W and C′, O′, W′, respectively. Thus, the normal reading shown in FIG. 22 is executed (Step 2224), and the data read out from the EEPROM 215 is output to the data line D′ and delivered to a data line through the tristate data buffer 212 controlled so as to be set on the output side. In the case of a reading operation, the address A is not passed through the latch 214 for address but input directly to the EEPROM 215 as an address AA.

In the case of a writing operation, the address A and the data D are applied, and the control signals $\overline{CE}=0$, $\overline{OE}=1$ and $\overline{WE}=1$ are input. When the write enable signal $\overline{WE}$, which has changed from the state 1 to the state 0, changes from the state 0 to the state 1, the control signals $\overline{CE}$, $\overline{OE}$, the data D and the address A are temporarily latched by the latches 211, 213 and 214, respectively (Step 2221 shown in FIG. 22). At the same time, the busy signal $\overline{BY}$ is output in order to inform external devices of the execution of a writing mode.

Thereafter, the outputs C, O and W from the latch 211 for control signals are delayed by the delay circuit 217 (Step 2222 shown in FIG. 22), and the output signals C′, O′ and W′ from the delay circuit 217 are input to the control circuit 216, whereby a writing operation is executed (Step 2223). It is possible to effect a normal reading operation during a period of time which starts when the write signals are latched and which ends when a writing operation starts, by appropriately adjusting the delay caused by the delay circuit 217. However, once a writing operation is started, the writing operation is automatically progressed by the control circuit 216, and any reading operation is prohibited. The time required for writing is about 1 mS to 20 mS.

Figure 23A:
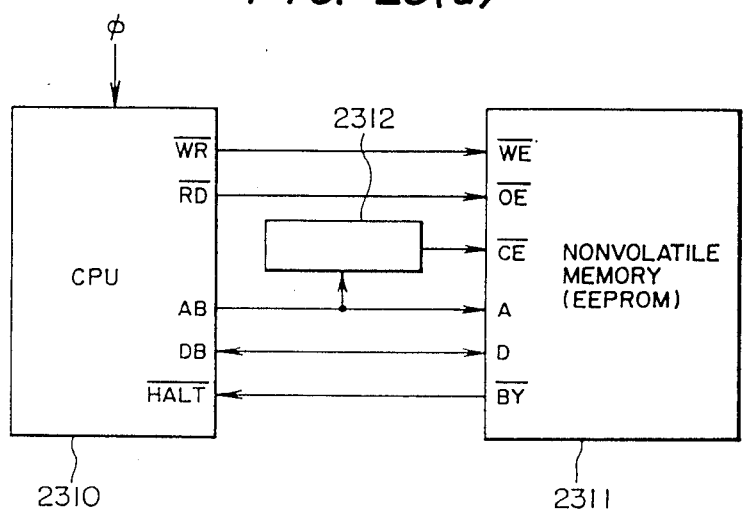
FIG. 23 shows an arrangement in which a semiconductor integrated circuit with a nonvolatile memory according to the present invention and a CPU are fabricated on a single one chip, which also illustrates a flow chart showing the operation of this arrangement.
Figure 23B:
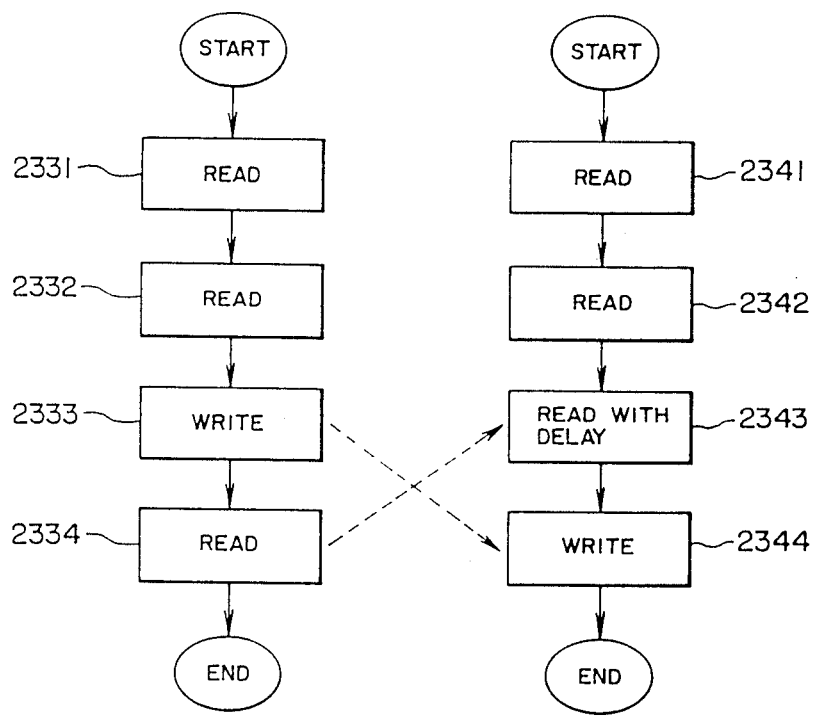

FIGS. 23(a) and 23(b) are a block diagram and an operation flow chart, respectively, showing an example in which a nonvolatile memory (EEPROM) according to the present invention is applied to a microcomputer system.

A CPU (Central Processing Unit) 2310 and a nonvolatile memory (EEPROM) 2311 are connected together through a write signal bus $\overline{WR}$, a read signal bus $\overline{RD}$, an address bus AB, a data bus DB and a halt signal bus $\overline{HALT}$. It is to be noted that an input to a chip enable terminal CE of the nonvolatile memory 2311 is supplied through a circuit 2312 which decodes the address signal on the address bus AB. The reference symbol $\phi$ denotes a clock signal which is applied to the CPU 2310 so as to serve as a machine clock signal. The write signal $\overline{WR}$ becomes a write enable signal $\overline{WE}$ in the memory 2311, and the read signal $\overline{RD}$ becomes an output enable signal $\overline{OE}$ in the memory 2311. Similarly, the address bus AB is connected to an address terminal A, the data bus DB to a data terminal D, and the halt signal bus $\overline{HALT}$ to a busy signal terminal $\overline{BY}$. In the arrangement shown in FIG. 23, a program and data are stored in the same nonvolatile memory (EEPROM) 2311.

When the CPU 2310 is executing pipeline control, a series of instructions 2331 to 2334 are issued from the CPU 2310 as shown in FIG. 23(b), and processing is executed in the memory 2311 in the order, from Step 2341 to Step 2344, in response to the instructions. The CPU 2310 first gives instructions to read a present command (Step 2331). Next, the CPU 2310 gives instructions to read an operand (Step 2333), and then gives instructions to write the result of calculation of the operand (Step 2333). Then, the CPU 2310 gives instructions to read a subsequent command (Step 2334). In response to these instructions, the memory 2311 first reads a present command (Step 2341) and then reads an operand (Step 2342). Since the control signal is delayed in the memory 2311 as described above, even when the memory 2311 receives the write instructions, it first executes a read operation instructed by the command received subsequently to the write command (Step 2343). After the delay has elapsed, the memory 2311 executes the operation of writing the result of calculation (Step 2344).

Figure 24:
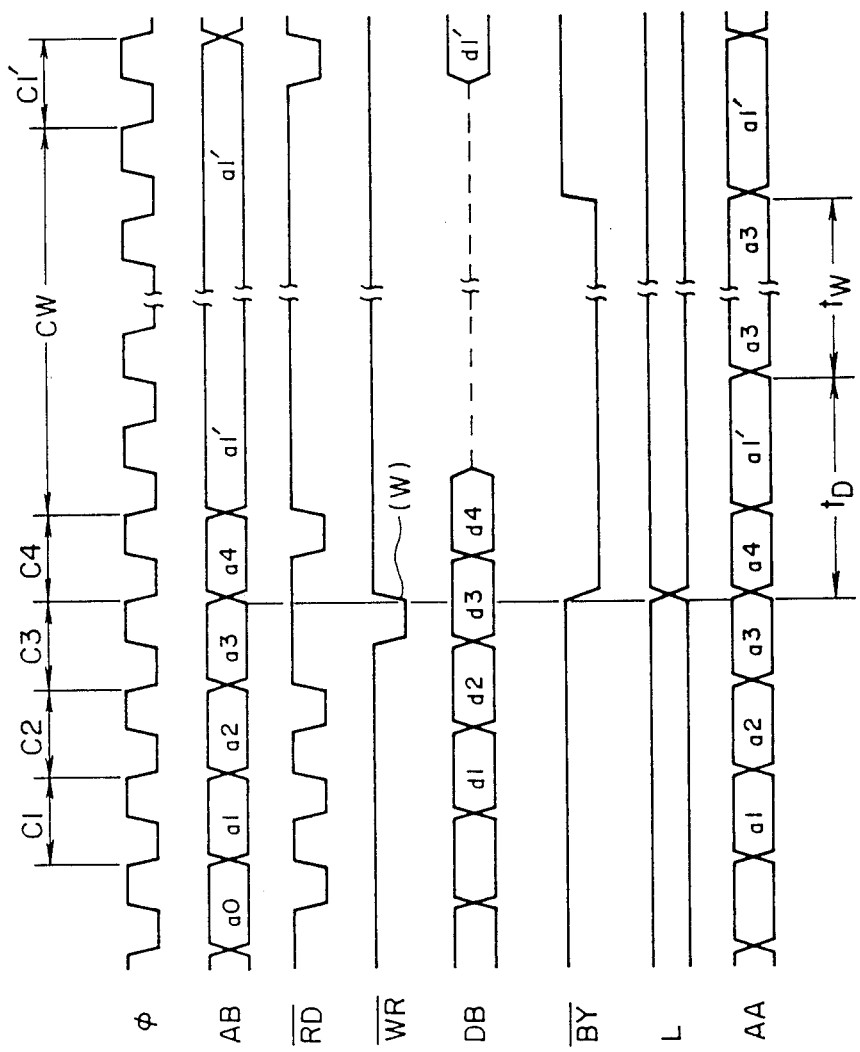
FIG. 24 is a time chart showing the operation of the arrangement illustrated in FIG. 23.

FIG. 24 is a timing chart showing the operation of the arrangement illustrated in FIG. 23.

The operation timing of the CPU 2310 is synchronous with clocks denoted by $\phi$ in FIG. 24. One machine cycle consists of four cycles C1 to C4. In this embodiment, the reading cycle consists of C1, C2 and C4, and the writing cycle consists of C3. In other words, in the case of pipeline control, access is carried out in the following order: reading of a present command, reading of an operand, writing of the result of calculation, and reading of a subsequent command. The waiting cycle CW represents a waiting state which starts when the CPU 2310 shown in FIG. 23 receives the halt signal $\overline{\text{HALT}}$, i.e., when the memory 2311 is outputting the signal $\overline{\text{BY}}$ which informs the CPU 2310 of a writing state and the machine cycle has ended, that is, the cycle C4 has been executed. The reference numeral a0 on the address bus AB represents the address of the previous operation. When addresses a1 and a2 are delivered to the address bus AB by the CPU 2310, these addresses are input to the memory 2311 in the form of the memory address AA by the control effected by the latch signal L. In consequence, the data d1 and d2 which are read out from the memory 2311 are output to the data bus DB. When the write signal $\overline{\text{WR}}$ rises (w) in the writing cycle C3, the address a3, the data d3 and the signals RD, WR are latched by the respective latch circuits in the memory 2311. In other words, the above-described latch signal L changes at the time (t). In addition, at the time (w), the busy signal $\overline{\text{BY}}$ which represents that the write signal has been received is output. In FIG. 24, the reference symbol AA denotes addresses given to the EEPROM 215, $t_D$ a delay given by the delay circuit 217, and $t_W$ the time of writing given by the control circuit 216.

In the writing cycle C3, after the data necessary for writing has been latched by the latch circuits in the memory 2311, a normal reading can be executed during the period $t_D$; therefore, the CPU 2310 gives instructions of reading in the cycle C4 during the period $t_D$. More specifically, the CPU 2310 delivers the read address a4 to the address bus AB and also delivers a read signal to the signal bus $\overline{\text{RD}}$ and , then the CPU 2310 enters the waiting cycle CW. In this case, the address in the waiting cycle CW is represented by a1'. At this time, although the busy signal BY is being output, since no writing control signal is output from the control circuit 216, reading is allowed. The memory 2311 receives a4 as a memory address AA and the read signal RD as a control signal and thereby reads out data d4 from the EEPROM 215 and outputs it to the data bus DB. After the delay has elapsed, a3 as a memory address AA and a control signal are given, and writing of the data d3 is thereby executed. In FIG. 24, the reference symbol C1' denotes a subsequent reading cycle during which data d1' is read out from the memory 2311. More specifically, the waiting state of the CPU 2310 is canceled when the halt signal $\overline{\text{HALT}}$ (synchronous with the busy signal $\overline{\text{BY}}$) is canceled, and a normal CPU cycle starts from the next cycle.

As has been described above, according to the present invention, the storage of both program and data which needs to be rewritten can be made with one chip even in the case of a system in which a reading cycle is set immediately after a writing cycle (e.g., a system which executes pipeline control). Accordingly, it becomes possible to fabricate an electrically erasable and programmable nonvolatile memory and a CPU in one chip, so that it is possible to realize an economical system.

What is claimed is:

1. A microcomputer which incorporates a nonvolatile semiconductor memory, said nonvolatile semiconductor memory comprising:
   a plurality of data memory elements arranged in a matrix;
   a protecting data memory element for storing at least 1-bit protection data disposed within said matrix;
   first means for accessing a selected one element within said plurality of data memory elements and said protection data memory element in accordance with an address signal specified with respect to said matrix; and
   second means for reading out the content of said protecting data memory element,
   whereby whether a programming (writing), erasing or reading operation with respect to said selected one element is to be allowed or inhibited is determined in accordance with the content of said protecting data memory element,
   wherein said first means accesses said selected one element and said protection data memory element via a common word line,
   wherein said data memory elements are respectively comprised of electrically erasable and programmable memory elements, and
   wherein said protecting data memory element is comprised of an electrically erasable and programmable memory element.

2. A microcomputer according to claim 1,
   wherein said first means simultaneously accesses said selected one element and said protection data memory element in a reading operation with respect to said selected one element.

3. A microcomputer according to claim 1,
   wherein said first means accesses said protection data memory element prior to accessing said selected one element in a programming (writing) or erasing operation with respect to said selected on element.

4. A microcomputer according to claim 1,
   wherein said microcomputer is applied to a card.

5. A microcomputer which incorporates a nonvolatile semiconductor memory, said nonvolatile semiconductor memory comprising:
   a plurality of data memory elements arranged in a matrix;
   a protecting data memory element for storing at least 1-bit protection data disposed within said matrix;
   first means for accessing a selected one element within said plurality of data memory elements and said protection data memory element in accordance with an address signal specified with respect to said matrix;
   second means for reading out the content of said protecting data memory element; and
   third means for generating an inhibition signal in response to the content of said protecting data and an external signal inputted from outside of said microcomputer,
   whereby whether a programming (writing), erasing or reading operation with respect to said selected one element is to be allowed or inhibited is determined in accordance with said inhibition signal,
   wherein said data memory elements are respectively comprised of electrically erasable and programmable memory elements, and
   wherein said protecting data memory element is comprised of an electrically erasable and programmable memory element.

6. A microcomputer according to claim 5,
   wherein said external signal is a signal for key word detection, and
   wherein said third means is a dismatching detection circuit.

7. A microcomputer according to claim 5, wherein said microcomputer is applied to a card.

8. A microcomputer which incorporates a nonvolatile semiconductor memory, said nonvolatile semiconductor memory comprising:
- a plurality of data memory elements arranged in a matrix;
- a plurality of protecting data memory elements disposed in one line of said matrix, wherein each protecting data memory element stores at least 1-bit protection data;
- first means for accessing a selected one element within said plurality of data memory elements and said protection data memory element in accordance with an address signal specified with respect to said matrix; and
- second means for reading out the content of said protecting data memory element,
- wherein said plurality of protecting data memory elements are disposed in one line of said matrix, each element stores at least 1-bit protection data, and each protection data corresponds to each row of said data memory matrix,
- whereby whether a programming (writing), erasing or reading operation with respect to said selected one element is to be allowed or inhibited is determined in accordance with the content of said corresponding protecting data memory element,
- wherein said first means accesses said selected one element and said protection data memory element via a common word line,
- wherein said data memory elements are respectively comprised of electrically erasable and programmable memory elements, and
- wherein said protecting data memory element is comprised of an electrically erasable and programmable memory element.

9. A microcomputer according to claim 8, wherein said microcomputer is applied to a card.

* * * * *